(12) United States Patent
Kim et al.

(10) Patent No.: US 9,373,369 B1
(45) Date of Patent: Jun. 21, 2016

(54) DATA STORAGE DEVICE AND OPERATING METHOD THEREOF

(71) Applicant: SK hynix Inc., Gyeonggi-do (KR)

(72) Inventors: Jin Woong Kim, Gyeonggi-do (KR); Soo Nyun Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/813,750

(22) Filed: Jul. 30, 2015

(30) Foreign Application Priority Data

Feb. 26, 2015 (KR) ........................ 10-2015-0027369

(51) Int. Cl.
| | |
|---|---|
| *G06F 13/00* | (2006.01) |
| *G11C 7/00* | (2006.01) |
| *G06F 13/18* | (2006.01) |
| *G06F 3/06* | (2006.01) |

(52) U.S. Cl.
CPC .............. *G11C 7/00* (2013.01); *G06F 3/067* (2013.01); *G06F 13/18* (2013.01)

(58) Field of Classification Search
CPC ............ G11C 7/00; G06F 13/18; G06F 3/067
USPC ........... 711/154, 158, 216, 221, 159; 365/218
See application file for complete search history.

(56) References Cited

U.S. PATENT DOCUMENTS

| | | | | |
|---|---|---|---|---|
| 7,070,113 | B2* | 7/2006 | Shiraishi .............. | G11C 16/349 235/492 |
| 8,230,234 | B2* | 7/2012 | Yoon ................... | G06F 12/1408 713/190 |
| 9,195,592 | B1* | 11/2015 | Weingarten ......... | G06F 12/0246 |
| 2008/0082736 | A1* | 4/2008 | Chow .................. | G06F 12/0246 711/103 |
| 2011/0161560 | A1* | 6/2011 | Hutchison ........... | G06F 12/0246 711/103 |
| 2013/0080716 | A1* | 3/2013 | Tamura ............... | G06F 12/0246 711/154 |
| 2013/0145083 | A1* | 6/2013 | Suzuki ................ | G06F 12/0246 711/103 |
| 2015/0098271 | A1* | 4/2015 | Lasser .................. | G11C 7/1006 365/185.11 |

FOREIGN PATENT DOCUMENTS

| | | |
|---|---|---|
| KR | 1020120082230 | 7/2012 |
| KR | 1020120125790 | 11/2012 |

* cited by examiner

*Primary Examiner* — Viet Q Nguyen
(74) *Attorney, Agent, or Firm* — IP & T Group LLP (57) ABSTRACT

A data storage device includes a nonvolatile memory apparatus including a plurality of memory areas, and a controller configured to randomize write data and generate random write data based on an offset value of a target memory area of the memory areas and a flag corresponding to the target memory area.

17 Claims, 6 Drawing Sheets

| MEMORY BLOCK | NUMBER OF ERASURES | FLAG |
|---|---|---|
| BLK0 | 102 | 10 |
| BLK1 | 100 | 00 |
| BLK2 | 97 | 01 |
| ... | ... | ... |
| BLKn | 79 | 11 |

DATA STORAGE DEVICE AND OPERATING METHOD THEREOF

CROSS-REFERENCES TO RELATED APPLICATION

The present application claims priority under 35 U.S.C. §119(a) to Korean application number 10-2015-0027369, filed on Feb. 26, 2015, in the Korean Intellectual Property Office, which is incorporated herein by reference in its entirety as set forth in full.

BACKGROUND

1. Technical Field

Various embodiments relate to a data storage device and, more particularly, to data randomizing of a data storage device.

2. Related Art

A data storage device stores data that is provided from an external device in response to a write request from the external device. The data storage device also provides the external device with stored data in response to a read request from the external device. The external device is an electronic device capable of processing data, and may include a computer, a digital camera, a cellular phone and the like. The data storage device may be embedded in the external device, or may be fabricated separately and then coupled to the external device.

The data storage device may be prepared in the form of a Personal Computer Memory Card International Association (PCMCIA) card, a Compact Flash (CF) card, a smart media card, a memory stick, various multimedia cards (MMC, eMMC, RS-MMC, and MMC-Micro), various secure digital cards (SD, Mini-SD, and Micro-SD), a Universal Flash Storage (UFS), a Solid State Drive (SSD) and the like.

The data storage device may include a nonvolatile memory apparatus to store data. Nonvolatile memory is able to retain stored data even without a constant source of power. Nonvolatile memory includes flash memory, such as NAND flash or NOR flash, Ferroelectrics Random Access Memory (FeRAM), Phase-Change Random Access Memory (PCRAM), Magnetoresistive Random Access Memory (MRAM), Resistive Random Access Memory (ReRAM), and the like.

SUMMARY

A data storage device according to an embodiment of the present invention may include a nonvolatile memory apparatus including a plurality of memory areas, and a controller suitable for randomizing write data and generating random write data based on an offset value of a target memory area of the memory areas and a flag corresponding to the target memory area.

A data storage device according to an embodiment of the present invention may include a nonvolatile memory apparatus including a plurality of first unit areas, wherein the first unit areas correspond to respective seed groups, and a controller suitable for selecting a seed from a seed group, corresponding to a target area of the first unit areas among the seed groups, based on a flag corresponding to the target area, and randomizing write data to generate random write data based on the seed.

An operating method of a data storage device according to an embodiment of the present invention may include referring to a flag corresponding to a target area of a plurality of unit areas, selecting a seed from a seed table based on an offset value of the target area and the flag, and randomizing write data of the target area by using the seed.

BRIEF DESCRIPTION OF THE DRAWINGS

Features, aspects, and embodiments are described in conjunction with the attached drawings, in which.

DETAILED DESCRIPTION

Hereinafter, a data storage device and an operating method thereof according to the present invention will be described with reference to the accompanying drawings through exemplary embodiments of the present invention. The present invention may, however, be embodied in different forms and should not be construed as limited to the embodiments set forth herein. Rather, these embodiments are provided to describe the present invention in detail to the extent that a person skilled in the art to which the invention pertains can enforce the technical concepts of the present invention.

It is to be understood that embodiments of the present invention are not limited to the particulars shown in the drawings, that the drawings are not necessarily to scale, and, in some instances, proportions may have been exaggerated in order to more clearly depict certain features of the invention. While particular terminology is used, it is to be appreciated that the terminology used is for describing particular embodiments only and is not intended to limit the scope of the present invention.

Figure 1:
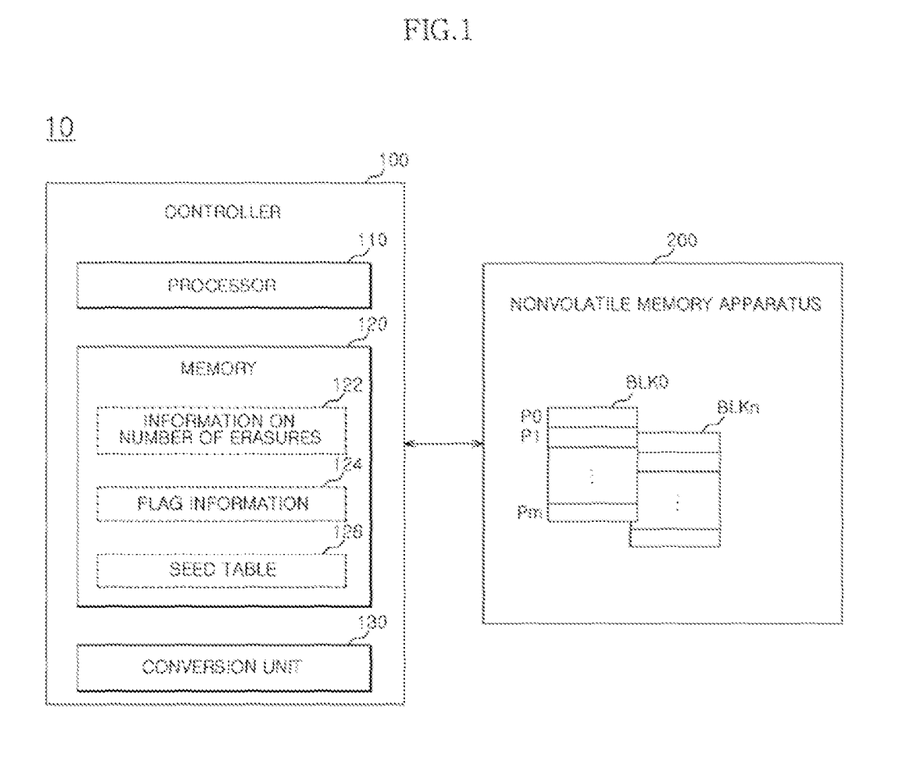
FIG. 1 is a block diagram illustrating a data storage device according to an embodiment of the present invention.

FIG. 1 is a block diagram illustrating a data storage device 10 according to an embodiment of the present invention.

The data storage device 10 may include a controller 100 and a nonvolatile memory apparatus 200.

The controller 100 may include a processor 110, a memory 120, and a conversion unit 130.

The processor 110 may control a general operation of the data storage device 10. The processor 110 may control a write operation or a read operation of the nonvolatile memory apparatus 200 in response to a write request or a read request of an external device. The processor 110 may generate commands for controlling the operations of the nonvolatile memory apparatus 200, and transmit the generated commands to the nonvolatile memory apparatus 200. The processor 110 may execute software programs on the memory 120 for controlling the operations of the data storage device 10.

The memory 120 may function as an operation memory, a buffer memory, a cache memory and the like of the processor 110. For example, as the operation memory, the memory 120 may store software programs driven by the processor 110, and various pieces of program data, such as information 122 on the number of erasures, flag information 124, and a seed table 126. Various types of information and various pieces of data stored in the memory 120 may be backed up by the nonvolatile memory apparatus 200, and loaded to the memory 120 for use as needed.

The conversion unit 130 may randomize data to be written in the nonvolatile memory apparatus 200, that is, write data, thereby generating random write data. The conversion unit 130 may derandomize data read from the nonvolatile memory apparatus 200, that is, random read data, thereby generating read data. The conversion unit 130 may derandomize the random read data in order to restore the write data before being randomized.

Under the control of controller the 100, the nonvolatile memory apparatus 200 may store the random write data outputted from the conversion unit 130, and read the stored random write data as random read data and transmit the random read data to the controller 100.

The nonvolatile memory apparatus 200 may include a plurality of memory blocks BLK0 to BLKn. Each of the memory blocks BLK0 to BLKn may include a plurality of pages. For example, the first memory block BLK0 may include pages P0 to Pm. Each of the pages P0 to Pm may have a corresponding offset value and may receive an address based on the corresponding offset value. For example, the first page P0 may have an offset value of "0" and the second page P1 may have an offset value of "1". The page may be a basic unit on which the write operation or the read operation of the nonvolatile memory apparatus 200 is performed. The memory block may be a basic unit on which the erase operation of the nonvolatile memory apparatus 200 is performed.

FIG. 1 illustrates that one nonvolatile memory apparatus 200 is included in the data storage device 10; however, the number of nonvolatile memory apparatuses included in the data storage device 10 is not limited thereto.

The processor 110 may manage the information 122 on the number of erasures, the flag information 124, and the seed table 126 with respect to memory areas of a predetermined unit, for example, first unit areas and second unit areas obtained by grouping the first unit areas. A second unit area may include a plurality of first unit areas. For example, a first unit area may be a page and a second unit area may be a memory block; however, the present invention is not limited thereto.

The processor 110 may mange the number of times the erase operation has been performed for each of the predetermined memory areas, that is, the number of erasures, as the information 122. For example, when the memory area is erased, the processor 110 may update the number of erasures of the erased memory area. When the nonvolatile memory apparatus 200 performs the erase operation on each memory block as the basic unit, the processor 110 may manage the number of erasures on the basis of memory blocks; however, the present invention is not limited thereto. The processor 110 may manage the information 122 on the number of erasures in order to uniformly use all memory areas and prevent abrasion concentration due to the concentrative use of a specific memory area.

The processor 110 may set flags corresponding to predetermined memory areas based on the information 122 on the number of erasures, and manage the flags as the flag information 124. In detail, the processor 110 may set a flag corresponding to a certain memory area based on the number of erasures of the corresponding memory area. Whenever the number of erasures of a certain memory area is updated, the processor 110 may set again the flag corresponding to the memory area. For example, when managing the number of erasures on the basis of memory blocks, the processor 110 may set one flag corresponding to a memory block based on the number of erasures of the memory block, and pages included in the memory block may correspond to the one flag in common.

The processor 110, for example, may set the remainder obtained by dividing the number of erasures of a certain memory area by $2^n$, as a flag corresponding to the memory area. In this case, the flag has a value of n bits in the binary system. In other words, the processor 110 may set n lower bits of the number of erasures of the certain memory area, expressed in the binary system, as a flag of n bits corresponding to the memory block. If the flag is changeable whenever the number of erasures is updated, the flag may be set in various methods other than the aforementioned setting method.

According to embodiments, the processor 110 may not separately manage the flag information 124, and may also generate a flag corresponding to a specific memory area with reference to the number of erasures of the memory area whenever necessary.

Based on an offset value of a memory area to be accessed, that is, a target memory area and a flag corresponding to the target memory area, the processor 110 may select seeds from the seed table 126. The target memory area may be a page. The processor 110 may control the conversion unit 130 to perform a randomization operation and a derandomization operation by using a selected seed. A method for the processor 110 to select seeds from the seed table 126 will be described in detail with reference to FIG. 4 later.

According to the present invention, the data storage device 10 selects seeds based on the offset value of the target memory area, so that it is possible to guarantee even usage between adjacent memory areas. Furthermore, the data storage device 10 selects seeds based on a flag corresponding to the target memory area, so that it is possible to prevent memory characteristics of the target memory area from being degraded by continuously storing similar data pattern in the target memory area.

Figure 2:
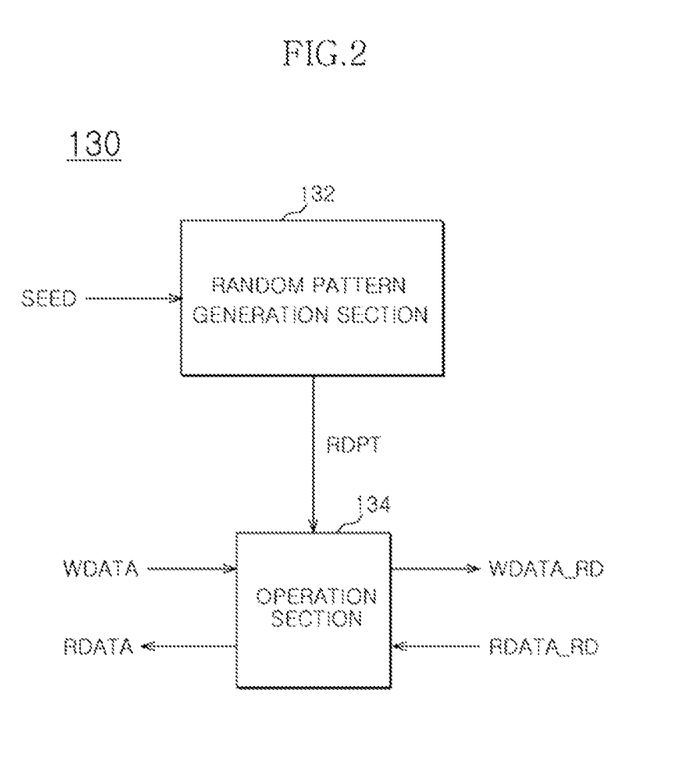
FIG. 2 is a block diagram illustrating a conversion unit of FIG. 1.

FIG. 2 is a block diagram Illustrating the conversion unit 130 of FIG. 1.

The conversion unit 130 may include a random pattern generation section 132 and an operation section 134.

The random pattern generation section 132 may receive a seed SEED selected by the processor 110, and generate and output a random pattern RDPT based on the seed SEED. The random pattern generation section 132, for example, may be implemented with a linear feedback shift register.

The operation section 134 may perform a logic operation on the random pattern RDPT and write data WDATA, thereby generating and outputting random write data WDATA_RD. The operation section 134 may perform a logic operation on the random pattern RDPT and random read data RDATA_RD, thereby generating and outputting read data RDATA. When the random write data WDATA_RD is Inputted to the conversion unit 130 as the random read data RDATA_RD, the operation section 134 may restore the write data WDATA. The operation section 134, for example, may perform a randomization or derandomization operation through an exclusive OR operation.

Figure 3:
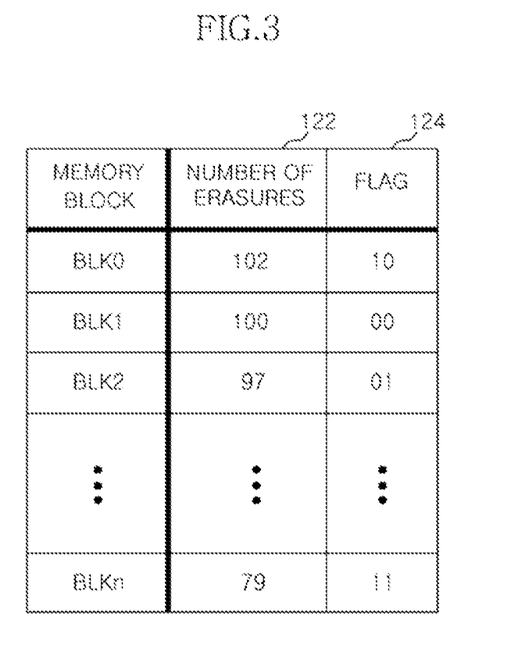
FIG. 3 is a diagram for explaining a method of a processor of FIG. 1 to set and manage information on the number of erasures and flag information.

FIG. 3 is a diagram for explaining a method of the processor 110 of FIG. 1 to set and manage the information 122 on the number of erasures and the flag information 124. Hereinafter, it is described as an example that the processor 110 manages the information 122 on the number of erasures and the flag information 124 on the basis of memory blocks. In FIG. 3, the number of erasures is expressed in the decimal system and a flag is expressed in the binary system.

The processor 110 may manage the number of times the erase operation has been performed for each of the memory blocks BLK0 to BLKn as the information 122 on the number of erasures. Whenever a memory block is erased, the processor 110 may increase the number of erasures of the erased memory block. Based on the number of erasures of the memory blocks BLK0 to BLKn, the processor 110 may set flags corresponding to the memory blocks BLK0 to BLKn and manage the flags as the flag information 124. The processor 110, for example, may set the remainder obtained by dividing the number of erasures of a certain memory block by 4 as a flag corresponding to the memory block. In this case, the flag has a value of 2 bits in the binary system.

Figure 4A:
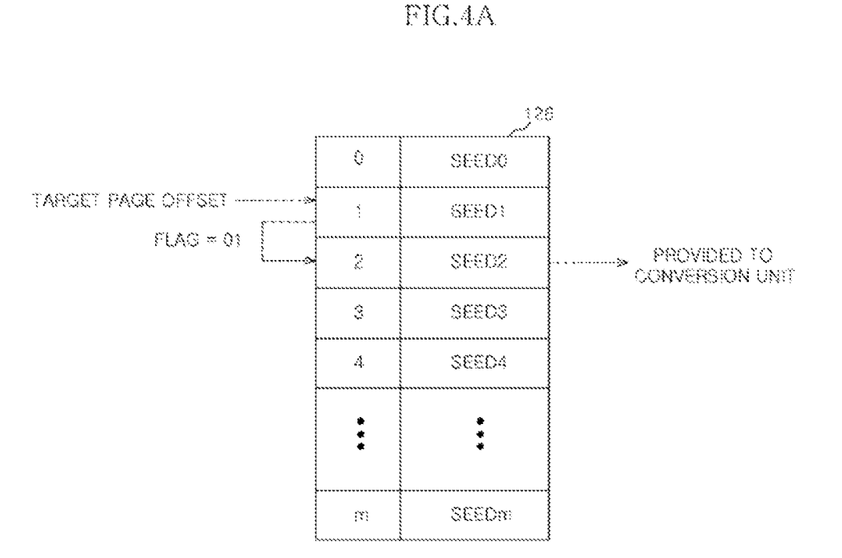
FIG. 4A and FIG. 4B are diagrams for explaining a method of a processor of FIG. 1 to select a seed to be provided from a seed table to a conversion unit.
Figure 4B:
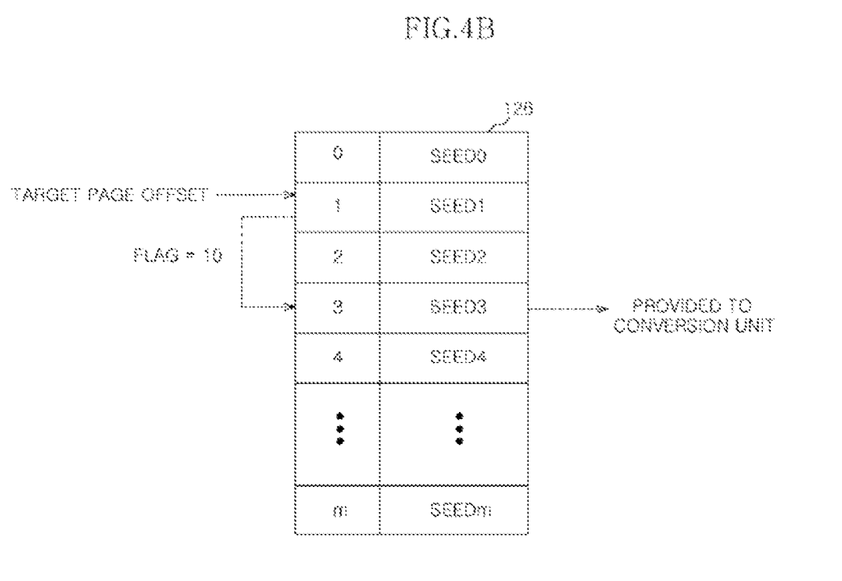

FIG. 4A and FIG. 4B are diagrams for explaining a method of the processor 110 of FIG. 1 to select a seed to be provided from the seed table 126 to the conversion unit 130. Hereinafter, with reference to FIG. 4A and FIG. 4B, the seed selection method of the processor 110 will be described in detail.

The seed table 126, for example, may include a plurality of seeds SEED0 to SEEDm corresponding to the number of pages included in one memory block. The plurality of seeds SEED0 to SEEDm may be indexed with offset values of pages (for example, P0 to Pm) included in one memory block.

The processor 110 may select a seed to be provided from the seed table 126 to the conversion unit 130 based on an offset value and a flag of a page to be accessed, that is, a target page. In detail, the processor 110 may recognize the offset value of the target page, for example, through an address of the target page, and may refer to a flag corresponding to a memory block including the target page in the flag information 124. The processor 110 may select a seed indicated by a value obtained by adding the flag to the offset value in the seed table 126. In other words, the processor 110 may select a seed separated by the flag from a seed indicated by the offset value of the target page.

Referring to FIG. 4A, for example, when the target page is the second page P1 of the third memory block BLK2, the processor 110 may confirm that a flag corresponding to the third memory block BLK2 is "01" with reference to the flag information 124. The processor 110 may select a seed SEED2 indicated by a value obtained by adding a flag "01" to the offset value "1" of the second page P1 in the seed table 126.

The selected seed may be provided to the conversion unit 130, and the conversion unit 130 randomizes inputted write data WDATA or derandomizes inputted random read data RDATA_RD.

According to the present invention, even though substantially the same write data is repeatedly stored in substantially the same page, different seeds are selected based on flags reset whenever the write data is stored, and the conversion unit 130 generates different random write data. Referring to FIG. 4B, when substantially the same write data is stored in the second page P1 again, the offset value of the target page is "1" as is, but the flag is set again to "10" from "01" as the number of erasures of the third memory block BLK2 including the second page P1 increases. Accordingly, the processor 110 may select a new seed SEED3 indicated by a value obtained by adding the flag "10" to the offset value "1" of the second page P1 in the seed table 126.

According to embodiments, the processor 110 may be implemented to select a specific seed from the seed table 126 through various operations using the offset value and the flag, as well as the add operation of adding the flag to the offset value.

Meanwhile, with respect to a certain target page, seeds selectable from the seed table 126 based on flags of n-bits may be limited. That is, with respect to the certain target page, the processor 110 may select a total of $2^n$ seeds that are different from one another, inclusive of a seed indicated by the offset value of the target page in the seed table 126. For example, referring to FIG. 4A, when the target page is the second page P1, the processor 110 may select any one of the seeds SEED1 to SEED4 based on the referred 2-bit flags. A predetermined number of seeds selectable with respect to the certain target page may form a seed group. For example, the second page P1 may correspond to a seed group including the seeds SEED1 to SEED4.

From this standpoint, according to embodiments, the processor 110 may manage seed groups corresponding to memory areas, respectively. The seed group may include a plurality of seeds indexed with flags. The processor 110 may select a seed indexed with a flag corresponding to the target page from a seed group corresponding to a target memory area.

Figure 5:
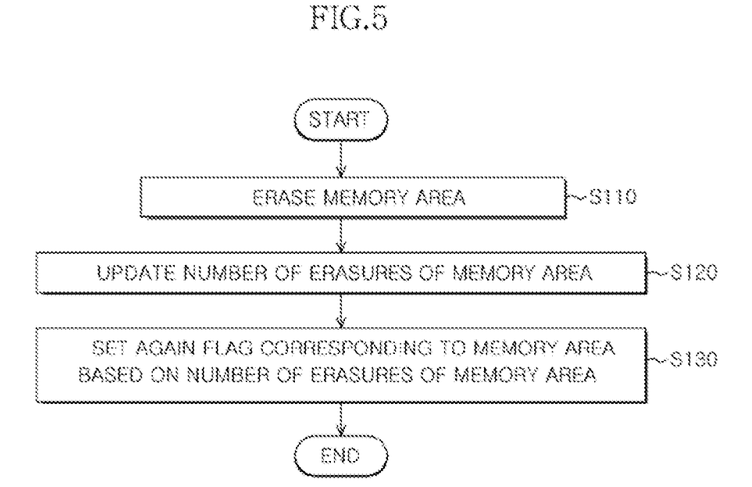
FIG. 5 is a flowchart for explaining a flag setting method of a data storage device according to an embodiment of the present invention.

FIG. 5 is a flowchart for explaining a flag setting method of the data storage device 10 according to the embodiment.

In step S110, a memory area may be erased. The nonvolatile memory apparatus 200 may perform an erase operation on a memory area under the control of the processor 110. In step S120, the processor 110 may update the number of erasures of the erased memory area. In step S130, based on the number of erasures of the erased memory area, the processor 110 may set again a flag corresponding to the erased memory area.

Figure 6:
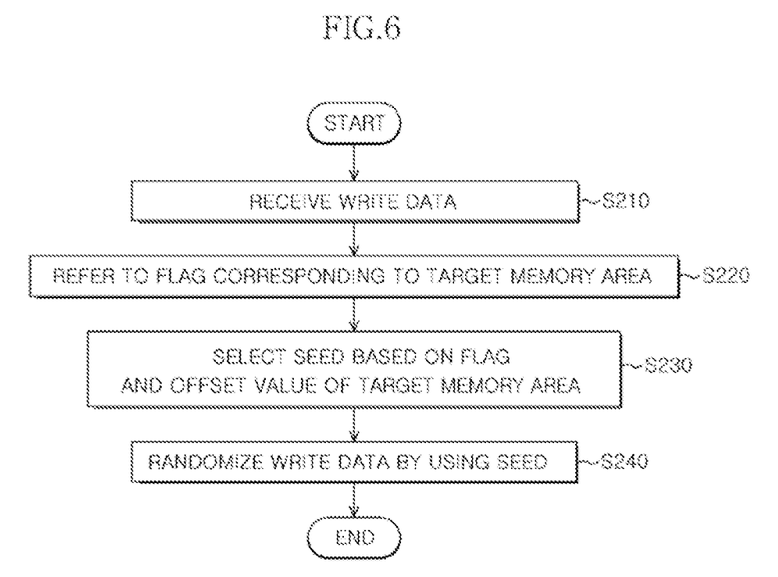
FIG. 6 is a flowchart for explaining a randomization method of a data storage device according to an embodiment of the present invention.

FIG. 6 is a flowchart for explaining a randomization method of the data storage device according to the embodiment.

In step S210, the conversion unit 130 may receive write data. In step S220, the processor 110 may refer to a flag corresponding to a target memory area in the flag information 124. In step S230, based on the offset value of the target memory area and the referred flag, the processor 110 may select a seed from the seed table 126. In step S240, the processor 110 may randomize the write data by using the seed.

Figure 7:
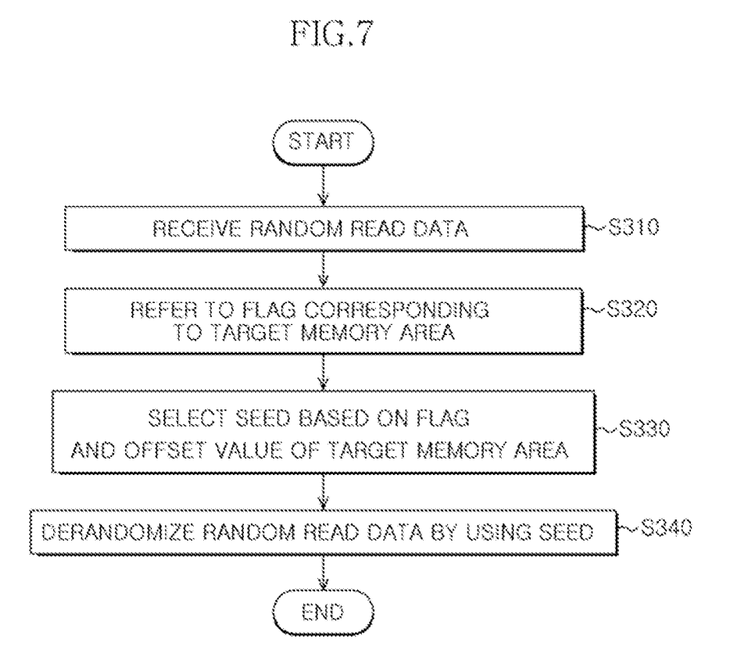
FIG. 7 is a flowchart for explaining a derandomization method of a data storage device according to an embodiment of the present invention.

FIG. 7 is a flowchart for explaining a derandomization method of the data storage device according to the embodiment.

In step S310, the conversion unit 130 may receive random read data. In step S320, the processor 110 may refer to a flag corresponding to a target memory area in the flag information 124. In step S330, based on the offset value of the target memory area and the referred flag, the processor 110 may select a seed from the seed table 126. In step S340, the processor 110 may derandomize the random read data by using the seed.

While certain embodiments have been described above, it will be understood to those skilled in the art that the embodiments described are examples only. Accordingly, the data storage device and the operating method thereof described herein should not be limited based on the described embodiments. Rather, the data storage device and the operating method thereof described herein should only be limited in light of the claims that follow when taken in conjunction with the above description and accompanying drawings.

What is claimed is:
1. A data storage device comprising:
a nonvolatile memory apparatus including a plurality of memory areas; and
a controller suitable for randomizing write data and generating random write data based on an offset value of a target memory area of the memory areas and a flag corresponding to the target memory area, wherein the controller sets the flag based on a number of times an erase operation is performed on the target memory area.

2. The data storage device according to claim 1, wherein the controller sets the flag again whenever the number of times of the erase operation is performed is updated.

3. The data storage device according to claim 1, wherein the controller selects a seed from a plurality of seeds based on the offset value and the flag, and randomizes the write data using the seed.

4. The data storage device according to claim 3, wherein the plurality of seeds are indexed with offset values of the memory areas.

5. The data storage device according to claim 1, wherein the nonvolatile memory apparatus performs a write operation for storing the random write data on the target memory area.

6. The data storage device according to claim 1, wherein the controller derandomizes random read data read from the target memory area to generate read data based on the offset value and the flag.

7. A data storage device comprising:
a nonvolatile memory apparatus including a plurality of first unit areas, wherein the first unit areas correspond to respective seed groups; and
a controller suitable for selecting a seed from a seed group, corresponding to a target area of the first unit areas among the seed groups, based on a flag corresponding to the target area, and randomizing write data to generate random write data based on the seed,
wherein the controller sets the flag based on a number of times an erase operation is performed on the target area.

8. The data storage device according to claim 7, wherein the seed group includes a plurality of seeds indexed by the flag.

9. The data storage device according to claim 7, wherein the first unit areas are grouped into second unit areas, and the nonvolatile memory apparatus performs an erase operation on each of the second unit areas, and the controller sets one flag per second unit area.

10. The data storage device according to claim 7, wherein the controller generates a random pattern based on the seed, and performs a logic operation on the write data and the random pattern to generate the random write data.

11. The data storage device according to claim 7, wherein the nonvolatile memory apparatus performs a write operation for storing the random write data on the target area.

12. The data storage device according to claim 7, wherein the controller derandomizes random read data read from the target area to generate read data based on the seed.

13. An operating method of a data storage device, comprising:
setting a flag based on a number of times an erase operation is performed on a target area:
selecting a seed from a seed table based on an offset value of the target area and the flag; and
randomizing write data of the target area by using the seed.

14. The operating method according to claim 13, further comprising:
erasing the target area;
updating the number of times the target area is erased; and
setting the flag again based on the number of times the target area is erased.

15. The operating method according to claim 13, wherein the selecting of the seed comprises:
calculating a sum of the offset value and the flag; and
selecting a seed indicated by the sum from the seed table.

16. The operating method according to claim 13, wherein the randomizing of the write data comprises:
generating a random pattern by using the seed; and
performing a logic operation on the write data and the random pattern and generating random write data.

17. The operating method according to claim 13, further comprising:
derandomizing random read data read from the target area by using the seed.

* * * * *